US008197900B2

(12) United States Patent
Shinohara et al.

(10) Patent No.: US 8,197,900 B2
(45) Date of Patent: Jun. 12, 2012

(54) COATING METHOD AND COATING APPARATUS

(75) Inventors: Yasuo Shinohara, Ibaraki (JP); Koichiro Watanabe, Ehime (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 461 days.

(21) Appl. No.: 12/414,308

(22) Filed: Mar. 30, 2009

(65) Prior Publication Data

US 2009/0252878 A1 Oct. 8, 2009

(30) Foreign Application Priority Data

Mar. 31, 2008 (JP) ................................ P2008-090694

(51) Int. Cl.
*B05D 3/12* (2006.01)
*C23C 16/52* (2006.01)
*B05C 11/02* (2006.01)
*B05C 11/00* (2006.01)

(52) U.S. Cl. ............ 427/355; 427/8; 427/359; 118/325; 118/708

(58) Field of Classification Search .................. 118/325, 118/708
See application file for complete search history.

(56) References Cited

U.S. PATENT DOCUMENTS

2004/0037959 A1* 2/2004 Mirkin et al. ................. 427/256

FOREIGN PATENT DOCUMENTS

JP 2003-53234 A 2/2003
JP 2003-170104 A 6/2003

* cited by examiner

*Primary Examiner* — Michael Cleveland
*Assistant Examiner* — James M Mellott
(74) *Attorney, Agent, or Firm* — Birch, Stewart, Kolasch & Birch, LLP

(57) ABSTRACT

There is provided a coating method for forming a coat having a less unevenness in its thickness on a sheet-like substrate. In the method in which a coating liquid is continuously supplied from a supply head to a surface of a continuously traveling sheet-like substrate to form a coat while controlling its thickness by a coating bar disposed above the sheet-like substrate, the coating liquid of which amount corresponds to an amount required for forming a predetermined coat thickness is continuously and constantly supplied to the surface of the sheet-like substrate, and the coating bar is moved up and down on the basis of increase and decrease in an amount of a holdup of the coating liquid which is formed just near the coating bar, so that the coat is formed.

2 Claims, 2 Drawing Sheets

COATING METHOD AND COATING APPARATUS

FIELD OF THE INVENTION

The present invention relates to a coating method and a coating apparatus for forming a coat on a sheet-like substrate. In more detail, it relates to a coating method and a coating apparatus for simply forming a coat on a sheet-like substrate with a less unevenness in a thickness of the coat.

CROSS REFERENCE TO RELATED APPLICATION

The present application claims the priority under the Paris Convention based on Japanese Patent Application No. 2008-090694, which is incorporated herein by reference in their entirety.

BACKGROUND OF THE INVENTION

As a coating method for forming a coat on a sheet-like substrate, a bar-coating method has been widely used because its simple structure and operation enable a high-speed coating.

This method is a method in which a coating liquid is supplied onto a sheet-like substrate to form a coat while controlling its thickness by means of a coating bar. The coat thus formed is converted, by hardening (for example, by curing), to a coating film to be used.

However, recently, a sheet-like substrate having a coating film formed thereon is widely used for various purposes, and there is a growing demand for a coating film having a more uniform film thickness. By making the thickness of the coat more uniform, a coating film having a more uniform film thickness is obtained.

As to the bar-coating method, for example the following methods are proposed for making the coat more uniform: a method in which a coating liquid of which amount is at least 1.1 times more than an amount of the coating liquid to be coated is supplied so that the coating liquid is flown toward both sides of a web from its center (see Patent Document 1 below); and a method in which a coating liquid held in a liquid dam is stirred in the case wherein the coating liquid contains sedimentary particles (see patent Document 2 below).

Although unevenness in the coat thickness is reduced by these methods, a simple coating method for forming a coat on a sheet-like substrate, which coat has a less unevenness in the coat thickness, is still desired.

Patent Document 1:

Japanese Patent Kokai Publication No. 2003-053234A

Patent Document 2:

Japanese Patent Kokai Publication No. 2003-170104A

SUMMARY OF THE INVENTION

It is an object of the present invention to provide a simple coating method for forming a coat on a sheet-like substrate, which coat has a less unevenness in the coat thickness.

The present inventors intensively studied a coating method in which a coating liquid is continuously supplied from a supply head to a surface of a continuously traveling sheet-like substrate to form a coat while controlling a coat thickness by a coating bar disposed above the sheet-like substrate. As a result, they have found as follows. The coating liquid of which amount corresponds to an amount required for forming a predetermined coat thickness is continuously and constantly supplied, and the coating bar is moved up or down depending on increase or decrease respectively in an amount of a holdup of the coating liquid formed on a just near side of the coating bar, whereby it is possible to simply form the coat on the sheet-like substrate, which coat has a less unevenness in its thickness. Thus, we have arrived at the present invention.

That is, the present invention provides a coating method in which a coating liquid is continuously supplied from a supply head to a surface of a continuously traveling sheet-like substrate to form a coat on the substrate while controlling a coat thickness by a coating bar disposed above the sheet-like substrate, wherein the coating liquid of which amount corresponds to an amount required for forming a predetermined coat thickness is continuously and constantly supplied to a generally central portion of the surface of the sheet-like substrate, and the coat is formed by the coating bar while the coating bar is moved up and down on the basis of increase and decrease in an amount of a holdup of the coating liquid formed just near (or adjacent to) the coating bar.

Further, the present invention provides a coating apparatus in which a coating liquid is continuously supplied to a surface of a continuously traveling a sheet-like substrate to form a coat on the surface, the apparatus comprising:

a backup roll for holding the continuously travelling sheet-like substrate;

a coating bar which is disposed opposite to the backup roll with the sheet-like substrate interposed therebetween and controls a coat thickness;

a supply head for continuously and constantly supplying the coating liquid to a generally central portion of the surface of the sheet-like substrate;

side dams which are disposed orthogonally to the coating bar and which are placed along either side of the sheet-like substrate respectively with respect to of a traveling direction so as to hold thus supplied coating liquid;

a holdup sensor for monitoring an increase and decrease in an amount (preferably a level) of a holdup of the coating liquid, which is formed on a just near side of (or adjacent to) the coating bar; and a means for moving up and down the coating bar on the basis of the increase and decrease in the amount of the holdup of the coating liquid monitored by the holdup sensor.

According to the coating method and the coating apparatus of the present invention, it is possible to simply form the coat on the sheet-like substrate, which coat has the less unevenness in its thickness.

REFERENCE NUMERALS

Figure 1:
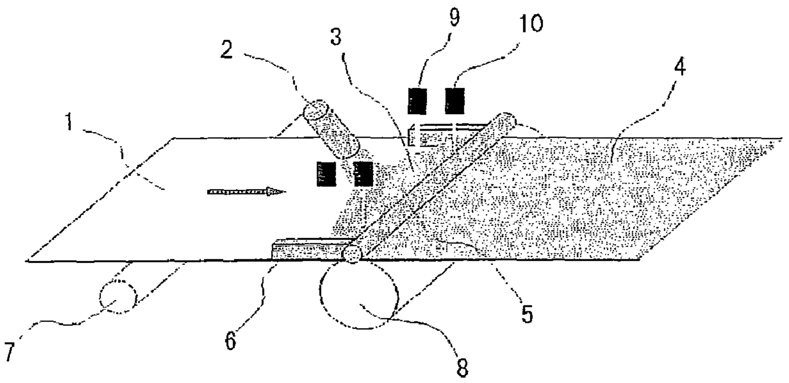
FIG. 1 is a perspective view schematically showing one embodiment of the present invention.

1 sheet-like substrate
2 supply head of coating liquid
3 holdup (or pool) of coating liquid

4 coat
5 coating bar
6 side dam
7 support roll
8 backup roll
9 near side holdup sensor
10 rear side holdup sensor
11 attachment plate
12 cotter
13 servo motor
14 air cylinder
15 control device

DETAILED DESCRIPTION OF THE INVENTION

Figure 2:
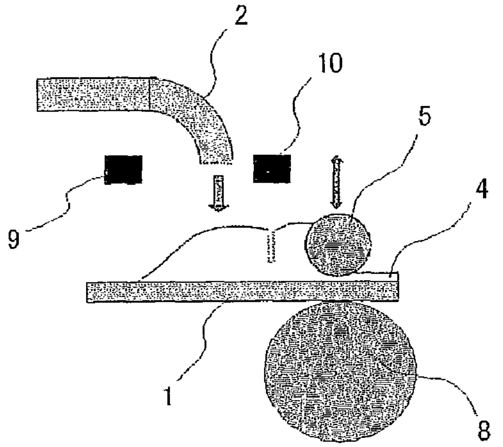
FIG. 2 is a cross sectional view schematically showing one embodiment of the present invention.

FIGS. 1 and 2 show one embodiment of the present invention. FIG. 1 is a perspective view, and FIG. 2 is a cross sectional view with respect to a travelling direction of the sheet-like substrate.

The sheet-like substrate 1 is continuously traveling over a support roll 7 and a backup roll 8 in an arrow direction as shown. A coating bar 5 is disposed opposite to the backup roll with the sheet-like substrate interposed therebetween.

Side dams 6 are disposed orthogonally to the coating bar and extend on either side of the sheet-like substrate with respect to the traveling direction of the substrate. The coating liquid is continuously and constantly supplied to a generally central portion of a surface of the sheet-like substrate from a supply head 2 of the coating liquid. The supplied coating liquid spreads toward both sides of the sheet-like substrate and forms a coating liquid holdup 3 on a region of the substrate defined by the coating bar and the side dams. A coat 4 of which coating thickness is controlled by the coating bar is formed. Two holdup sensors are disposed on the near side of the supply head with respect to the travelling direction of the sheet-like substrate (i.e. on the near side of the supply head which side is opposite to the coating bar), while two holdup sensors are disposed on the rear side of the supply head with respect to the traveling direction of the sheet-like substrate (i.e. between the supply head and the coating bar). The coating bar is moved up or down according to an increase or decrease in the amount (preferably a level) of the holdup of the coating liquid monitored (or detected) by the holdup sensors. The number of the holdup sensor(s) is not particularly limited, and it may be a single or plural.

It is noted that the terms "near" and "rear" are used herein when seeing the supply head of the coating liquid from the upstream side of the supply head toward the downstream side of the supply head along the traveling direction of the substrate.

Figure 3:
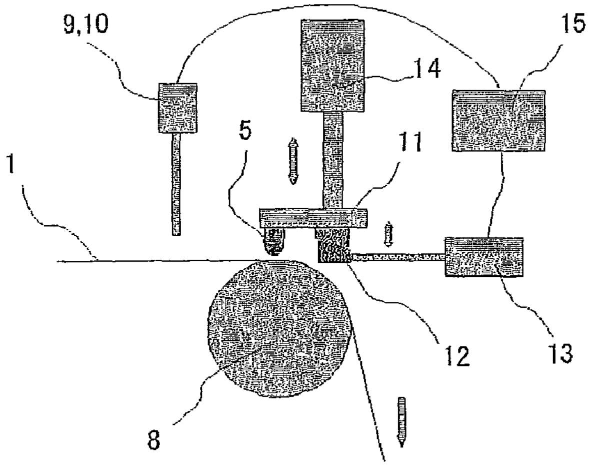
FIG. 3 is a view schematically showing one embodiment of an interval adjustment device used in the present invention.

It is note that, as shown in FIG. 3, the sheet-like substrate is usually allowed to travel obliquely downward after traveling over the backup roll in order to avoid an interval adjustment device and the like which will be described below.

When the amount of the holdup of the coating liquid monitored by any one of the two holdup sensors disposed on the near side exceeds a predetermined threshold value, the coating bar is moved up, and when the amount of the holdup of the coating liquid monitored by any one of the two holdup sensors disposed on the rear side falls below a predetermined threshold value, the coating bar is moved down.

Moving up and down of the coating bar is performed by the interval adjustment device based on a signal from the liquid reservoir detection sensor.

FIG. 3 is a schematic view showing one embodiment of the interval adjustment device used in the present invention.

The coating bar 5 is fixed to an attachment plate 11, and a cotter (wedge) 12 is fixed to the attachment plate, and the cotter is horizontally moved by a servo motor 13 so that the attachment plate and the coating bar are moved up or down. The servo motor is driven by a control device 15 which receives signals from the holdup sensors to move the cotter. An air cylinder 14 is fixed to the attachment plate, which is used for example when the coating bar is removed.

A traveling speed of the sheet-like substrate is usually from about 5 to 50 m/min., and preferably from 10 to 25 m/min., although it depends on a moving up and/or down speed of the coating bar, properties of the coating liquid and the like. When the traveling speed is too slow, productivity of forming the coat is lowered, and a too fast speed adversely affects the quality of the coat, which is not preferred.

The moving up or down speed of the coating bar is about 1 to 2 μm/sec. Although moving up or down of the coating bar may be continuously performed until returning to within the threshold value, it is preferably performed intermittently. For example, it is performed in a cycle consisting of moving it up or down for about 0.5 to 2 seconds and stopping it for about 1 to 2 minutes. The moving up and down operation of the coating bar may be automatically performed through the signal from the sensor. Alternatively, such operation may be manually performed in each operation provided that a request of the operation is indicated as an alarm.

The threshold values of the holdup sensors vary depending on the properties of the coating liquid, the intended coat thickness and the like. Regarding the sensor placed on the near side, its threshold value (which is represented by, for example, a reflected light amount or reflected light intensity) is usually set to an amount which corresponds to that no holdup of the coating liquid is present, or set to a level of the holdup of about 0 mm. When the level or the amount of the holdup exceeds the threshold value, namely if the holdup has started to spread out to reach the sensor, the coating bar is moved up. Regarding the sensor placed on the rear side, the threshold value (for example, the reflection light amount and the like) is set to the level of the holdup of the coating liquid within a range of about 3 to 10 mm, or set to an amount which corresponds to such level of the holdup of the coating liquid. When the level or the amount of the holdup falls below the threshold value, the coating bar is moved down.

The sheet-like substrate and the coating liquid are selected as necessary depending on a hardened or cured coating film to be produced. Examples of the sheet-like substrate include a resin sheet, an inorganic glass sheet, a fibrous sheet and the like.

Examples of the resin of the resin sheet include a polyolefin, a polyester, a polycarbonate, an acrylic resin, a triacetyl cellulose resin and the like.

In addition, a laminated sheet and a porous sheet of these resins are also examples of the resin sheet.

The coating liquid comprises a coating material and a solvent. Examples of the coating material include compositions that impart weather resistance, abrasion resistance, antistatic performance, antireflective performance, anti-glare properties, heat resistance and/or the like.

Many of these are usually active energy curable coating materials and thermosetting coating materials, which are cured by active energy rays or thermal energy.

The coating liquid contains an organic component, and optionally inorganic oxide fine particles, organic based fine particles, a photo initiator or a thermal initiator, a leveling agent (smoothing agent), an antioxidant, a UV absorber and/or the like, which imparts a function as necessary. The coating liquid further contains water or one or more various organic solvents for dissolving and/or dispersing the above mentioned component(s).

For example, in order to form an abrasion-resistant cured coating film, the following components are preferably used: a compound having a plurality of (meth)acryloyloxy groups such as dipentaerythritol hexaacrylate as the curable coating material; and a metal oxide such as antimony oxide, a compound oxide of indium/tin (ITO), a compound oxide of antimony/tin (ATO), a compound oxide of antimony/zinc, tin oxide doped with phosphorous (P) and/or the like for the oxide fine particles. Further, the followings are also preferably used: alcohols such as isopropyl alcohol, alkoxy alcohols such as 3-methoxy-1-propanol and the like as the solvent; and silicone oils and the like as the leveling agent.

The coating liquid for forming the hardened coating film which is heat resistant comprises a heat resistant resin and a solvent, and it may also comprise an inorganic fine powder as the coating material.

Examples of the heat resistant resin include a polyimide, a polyamideimide, an aromatic polyamide (which is hereinafter also referred to as aramid), a polycarbonate, a polyacetal, a polysulfone, a polyphenyl sulfide, a polyether ether ketone, an aromatic polyester, a polyether sulfone, a polyether imide and the like.

A polar organic solvent is usually used as the solvent for the preparation of the heat resistant resin solution. As the polar organic solvent, for example, N,N'-dimethylformamide, N,N'-dimethylacetoamide, N-methyl-2-pyrrolidone, tetramethyl urea, dimethyl sulfoxide, cresol, o-chlorophenol and the like may be exemplified.

The inorganic fine powder is made of an electrically insulating metal oxide, a metal nitride, a metal carbide or the like. For example, powder such as alumina, silica, titanium dioxide or zirconium oxide is preferably used. These inorganic fine powders may be used alone or in combination of two or more species.

When the coat formed by supplying the coating liquid to the surface of the sheet-like substrate contains the active energy curable coating material or the thermosetting coating material, it is dried and cured by being irradiated with active energy rays or thermal energy to give a coating film.

In the case wherein the coat thus formed contains the heat-resistant resin and the polar organic solvent, after it is left to stand in an atmosphere of which humidity is constantly controlled so that the heat resistant resin is partly precipitated, or after it is immersed in an aqueous solution or an alcohol-based solution as it is so that the heat resistant resin is precipitated, solvent extraction is carried out with a polar organic solvent that can dissolve the polar organic solvent, the water, the aqueous solution or the alcohol-based solution. Further, in the case of the heat resistant resin such as aramid which is not redissolved in a solution once it is precipitated from the solution, the heat resistant resin is precipitated simultaneously with the removal of the solvent by evaporating a part or all of the solvent. After removing the polar organic solvent, the coating film is obtained through drying thereof.

The drying is performed using a hot air drying furnace, an infrared drying furnace, a vacuum dryer or the like while appropriately selecting the temperature and time depending on the type of the coating material such as resin, the type of the solvent and the like.

By the simple method in which the coating liquid of which amount corresponds to an amount required for forming the predetermined coat thickness is continuously and constantly supplied, and the coating bar is moved up and down depending on the increase and decrease in the amount (preferably the level or height) of the holdup of the coating liquid formed just near the coating bar, a coat having the more uniform film thickness can be obtained.

EXAMPLES

The present invention will hereinafter be described in more detail by the examples, but the present invention is not limited by these examples.

The thickness of the obtained cured coating film was measured using a film thickness measuring device [F-20, manufactured by Filmetrics Co.] and the like in the case where the obtained cured coating film was a transparent coating film, or a film thickness measuring device [OF1000/USM200, manufactured by MeSys Co.] and the like in the case where the obtained coating film was a non-light permeable coating film.

Reference Example 1

Preparation of Coating Liquid

In the same manner as described in Example 1 of Japanese Patent Kokai Publication No. 2001-23602, paraphenylenediamine and terephthalic acid dichloride were polymerized so as to produce poly(paraphenylene terephthalamide) (which is hereinafter abbreviated as PPTA) using N-methyl-2-pyrrolidone as a solvent (hereinafter abbreviated as NMP).

Similarly, NMP was added to the resultant polymerization liquid to prepare a PPTA solution having a PPTA concentration of 2.0% by weight. Then, calcium oxide was added to thus prepared solution so as to perform neutralization, and the resultant neutralized product was obtained as the coating liquid.

In the same manner as described above with reference to FIGS. 1 to 3, the coating liquid was supplied to a surface of a sheet-like substrate, and a coat was formed. The backup roll 8 had a diameter of 135 mm, the support roll 7 had a diameter of 80 mm, and the coating bar was a bar of which lower portion had a semicircular shape in its cross section having a diameter of 20 mm. As shown in FIG. 1, two holdup sensors (FU35-FZ manufactured by Keyence Co.) were provided on the near side of the supply head (30 mm ahead of the position of the supply head of the coating liquid located at the center of the sheet substrate, and respectively on both the right and left sides at a distance of 250 mm from the supply head), and two liquid reservoir detection sensors were provided on the rear side (0 mm backward from the position of the supply head of the coating liquid as described above, and respectively on the both right and left sides at a distance of 250 mm from the supply head). However, the installation positions of the sensors are not limited to the above, and the sensor may be installed at any appropriate position as long as it can detect the amount (for example, the level) change of the coating liquid holdup in the state where the coating liquid holdup is present along the entire width of the coating bar.

Using a porous polyethylene film (trade name: HIGH-PORE, manufactured by ASAHI KASEI CO., thickness: 25 Atm, average pore diameter: 0.3 μm, porosity: 59% by volume) as the sheet-like substrate, it was allowed to travel at a speed of 12 m/min.

Before supplying the coating liquid, the support roll 7 was made impregnated with NMP, and NMP was applied from a lower surface of the porous film to fill its pores.

The coating liquid prepared in Reference Example 1 was supplied onto the porous film at 840 $cm^3$/min, and a coat having a width of 700 mm and a thickness of 100 μm was formed.

The coating bar was a bar of which lower portion had a semicircular shape in its cross section, and was fixed to the attachment plate 11. It was moved up and down by the interval adjustment device comprising a cotter 12 and a servo motor 13.

The threshold value of the holdup sensors disposed on the near side was set such that it corresponded to the reflected light amount of 100. When any one of these sensors produced a signal which indicated that the reflected light amount exceeded the threshold value, namely when the coating liquid holdup had started to spread out so that it reached the monitoring position, the interval adjustment device was activated by the signal from the sensor so as to move up the coating bar.

The threshold value of the holdup sensors disposed on the rear side was set such that it corresponded to the reflected light amount of 500. When any one of these sensors produced a signal which indicated that the reflected light amount fell below the threshold value, the interval adjustment device was activated by the signal from the sensor so as to move down the coating bar.

The moving up or down speed of the coating bar was about 2 μm/sec and the stop time was one minute.

Next, the porous film having the coat formed thereon was passed through a constant-temperature, constant-humidity chamber (set to a temperature of 50° C., and a relative humidity of 70%), PPTA was precipitated in the coat. Subsequently, ion exchanged water was supplied to a water washing device, in which the film was washed so that NMP and calcium chloride were removed from the coat. Thereafter, the resultant film with the coat was dried in a hot air drier to remove residual water, whereby a coating film made of a heat resistant porous layer of para-aramid was formed on the polyethylene porous film. The thickness of the porous film including the coating film was 28 μm, and thus the coating film had a thickness of 3 μm.

Figure 4:
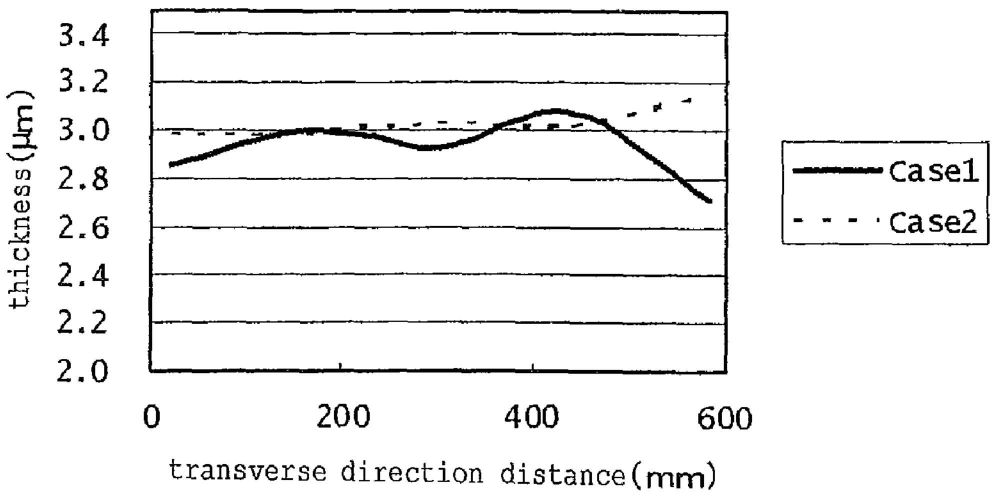
FIG. 4 shows measurement results of transverse thickness profiles of coating films produced in Example 1.

One example of the measurement results of the film thickness profile of the coating film along the transverse direction of the substrate is shown as Case 1 in FIG. 4. An average of the thickness was 2.91 μm, and a standard deviation of the thickness was 0.140 μm.

Another example of the measurement results of the film thickness profile of the coating film along the transverse direction of the substrate is shown as Case 2 in FIG. 4. An average of the thickness was 3.03 μm, and a standard deviation of the thickness was 0.067 μm.

Comparative Example 1

A coat was formed in the same manner as in Example 1, except that a coating width of 300 μm was applied instead of the coating width of 700 μm, and that instead of moving up and down the coating bar according to the threshold values of the four holdup sensors, one distance sensor (FU35-FZ manufactured by KEYENCE CO.) was disposed at the position of 20 mm backward from the position of the supply head of the coating liquid, and the following control manner was employed: the threshold value of the sensor was set such that it corresponded to the reflected light amount of the liquid reservoir of 500, when the threshold value fell below 500, the coating liquid was supplied, and when the threshold value exceeded 500, the supply of the coating liquid was stopped.

Figure 5:
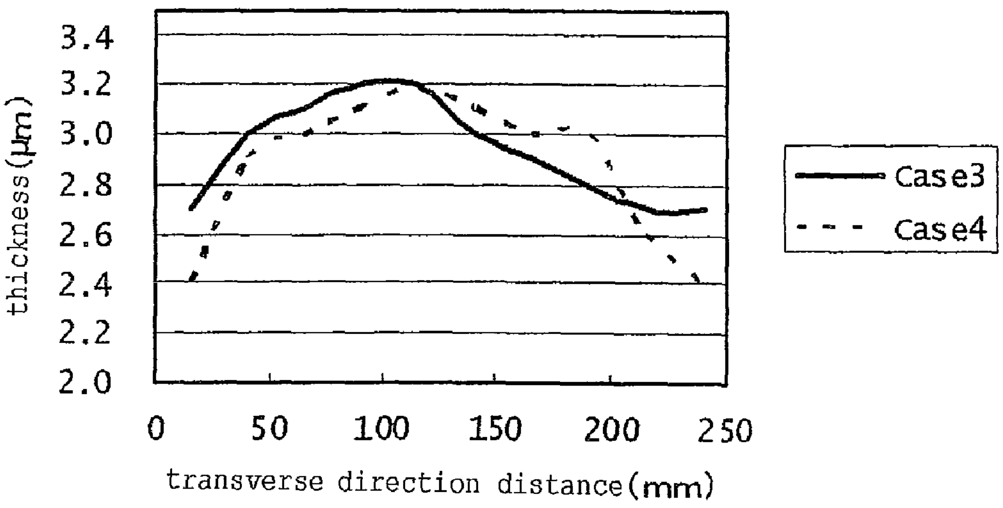
FIG. 5 shows measurement results of transverse thickness profiles of coating films produced in Comparative Example 1.

One example of the measurement results of the film thickness profile of the coating film along the transverse direction of the substrate is shown as Case 3 in FIG. 5. An average of the thickness was 2.93 μm, and a standard deviation of the thickness was 0.200 μm.

Another example of the measurement results of the film thickness profile of the coating film along the transverse direction of the substrate is shown as Case 4 in FIG. 5. An average of the thickness was 2.87 μm, and a standard deviation of the thickness was 0.294 μm.

What is claimed is:

1. A method for producing a coat in which a coating liquid is continuously supplied from a supply head to a surface of a continuously traveling sheet-like substrate to form a coat on the surface while controlling a coat thickness by a coating bar disposed above the sheet-like substrate, wherein the coating liquid of which amount corresponds to an amount required for forming a predetermined thickness of the coat is continuously and constantly supplied onto a generally central portion of the surface of the sheet-like substrate, and the coating bar is moved up and down on the basis of increase and decrease in an amount of a holdup of the coating liquid formed just near the coating bar, so that the coat is formed, and wherein holdup sensors are disposed on a near side and a rear side respectively of the supply head with respect to a travelling direction of the sheet-like substrate so as to monitor the increase and the decrease in the amount of the holdup of the coating liquid.

2. The method for producing a coat according to claim 1, wherein when the amount of the holdup exceeds a threshold value of the holdup sensor disposed on the near side, the coating bar is moved up, and when the amount of the holdup falls below a threshold value of the holdup sensor disposed on the rear side, the coating bar is moved down.

* * * * *